(12) United States Patent
Zhao

(10) Patent No.: US 10,825,767 B2
(45) Date of Patent: Nov. 3, 2020

(54) SEMICONDUCTOR PACKAGING STRUCTURE AND SEMICONDUCTOR DEVICE

(71) Applicant: Gpower Semiconductor, Inc., Suzhou (CN)

(72) Inventor: Shufeng Zhao, Suzhou (CN)

(73) Assignee: GPOWER SEMICONDUCTOR, INC., Suzhou (CN)

( * ) Notice: Subject to any disclaimer, the term of this patent is extended or adjusted under 35 U.S.C. 154(b) by 88 days.

(21) Appl. No.: 16/383,003

(22) Filed: Apr. 12, 2019

(65) Prior Publication Data

US 2019/0252314 A1    Aug. 15, 2019

Related U.S. Application Data

(63) Continuation of application No. PCT/CN2018/100352, filed on Aug. 14, 2018.

(30) Foreign Application Priority Data

Aug. 14, 2017   (CN) .......................... 2017 1 0693212

(51) Int. Cl.
| | | |
|---|---|---|
| *H01L 23/48* | (2006.01) | |
| *H01L 23/522* | (2006.01) | |
| *H01L 23/00* | (2006.01) | |
| *H01L 23/34* | (2006.01) | |
| *H01L 23/31* | (2006.01) | |
| *H01L 23/367* | (2006.01) | |

(52) U.S. Cl.
CPC ...... *H01L 23/5226* (2013.01); *H01L 23/3171* (2013.01); *H01L 23/34* (2013.01); *H01L 23/3672* (2013.01); *H01L 23/48* (2013.01); *H01L 24/17* (2013.01)

(58) Field of Classification Search
CPC ............ H01L 2224/97; H01L 29/7848; H01L 21/76877; H01L 2224/32145; H01L 25/0657; H01L 23/484; H01L 25/165; H01L 23/053; H01L 23/3675
USPC .................................. 257/678, 693, 697, 698
See application file for complete search history.

(56) References Cited

U.S. PATENT DOCUMENTS

| | | | | |
|---|---|---|---|---|
| 2012/0176716 | A1* | 7/2012 | Roy ................... | H01L 23/49575 361/111 |
| 2015/0255384 | A1* | 9/2015 | Carroll .............. | H01L 23/49575 323/244 |
| 2018/0190581 | A1* | 7/2018 | Lin .................... | H01L 21/76895 |
| 2019/0051619 | A1* | 2/2019 | Kim .................... | H01L 23/3128 |

(Continued)

*Primary Examiner* — S. V. Clark
(74) *Attorney, Agent, or Firm* — Flener IP & Business Law; Zareefa B. Flener; Ayhan E. Mertogul

(57) ABSTRACT

A semiconductor packaging structure for packaging a semiconductor chip is disclosed, the semiconductor chip comprises at least two electrodes, each of the at least two electrodes comprises at least one electrode opening, and the packaging structure comprises: a packaging chassis, provided with at least two pin electrodes respectively corresponding to the at least two electrodes; and at least two extended electrodes, each of the at least two extended electrodes being electrically connected to one of the at least two pin electrodes, and comprising at least one conductive pillar for inserting into the at least one electrode opening formed on one of the at least two electrodes.

20 Claims, 9 Drawing Sheets

(56) References Cited

U.S. PATENT DOCUMENTS

2019/0238134 A1\* 8/2019 Lee ............... H01L 29/7883
2020/0111765 A1\* 4/2020 Kim ............... H01L 21/6835

\* cited by examiner

US 10,825,767 B2

SEMICONDUCTOR PACKAGING STRUCTURE AND SEMICONDUCTOR DEVICE

CROSS-REFERENCE TO RELATED APPLICATIONS

This application is a continuation of International Application No. PCT/CN2018/100352 filed on Aug. 14, 2018, which claims priority to Chinese patent application No. 201710693212.6 filed on Aug. 14, 2017, all contents of which are incorporated by reference herein.

TECHNICAL FIELD

The present disclosure relates to the field of semiconductor technologies, particularly to a semiconductor packaging structure and a semiconductor device.

BACKGROUND

In the practical application of semiconductor power devices, in addition to the strict requirements on the basic characteristics of the used semiconductor power devices (for example, high withstand voltage characteristics, high current characteristics, and low on-resistance), there is a high demand for high reliability of semiconductor devices, so as to make the application system of semiconductor devices work stably. The reliability performance of semiconductor devices is mainly determined by the semiconductor device chip and the packaging technology. Especially when a qualified semiconductor device chip is available, it is particularly important to select a reasonable packaging method or technology.

With the rapid development of the third generation wide band gap semiconductor gallium nitride (GaN) and silicon carbide (SiC) technology, high-power semiconductor device chips with high voltage, high current, high frequency and other characteristics have been introduced. However, the parasitic inductance introduced by the packaging process will deteriorate the signal oscillation under the high-frequency working conditions, and the poor heat dissipation path will cause the heat generated by the device in the high-power working process to be unable to be guided away in time, resulting in a sharp rise in the junction temperature of the device. These negative phenomena directly affect the stability and efficiency of the application system of the semiconductor device. Therefore, the development of packaging methods and technologies with low parasitic parameters (low parasitic inductance, low parasitic resistance, etc.) and high thermal conductivity is gradually becoming a key research direction in improving the reliability of high frequency and high power semiconductor devices in the industry. At the same time, the realization of system size miniaturization is also required for the development of the industry.

At present, the packaging of the semiconductor power device chip in the industry mainly adopts Transistor Out-line (TO) series and Quad Flat No-lead (QFN) plastic packaging forms, and the packaging technology mainly adopts the wire bonding process to electrically connect relevant semiconductor chip electrodes with designated package pins through wires and metal strips. Since wire-bonded wires introduce the parasitic inductance introduced, the signal oscillation is aggravated under high-frequency operating conditions, resulting in poor system application stability. At the same time, a large amount of heat generated by high-power operation of the semiconductor device cannot be dissipated in time, resulting in performance degradation of the semiconductor device and even device failure. In addition, due to the bonding space requirement, the volume of the package cannot be made small, so the application module of the packaging structure cannot be miniaturized.

SUMMARY

In view of this, the present disclosure provides a semiconductor packaging structure and a semiconductor device to solve the above problems.

An aspect of the present disclosure provides a semiconductor packaging structure for packaging a semiconductor chip, the semiconductor chip comprises at least two electrodes, each of the at least two electrodes comprises at least one electrode opening, and the packaging structure comprises: a packaging chassis, provided with at least two pin electrodes respectively corresponding to the at least two electrodes; and at least two extended electrodes, each of the at least two extended electrodes being electrically connected to one of the at least two pin electrodes, and comprising at least one conductive pillar for inserting into the at least one electrode opening formed on one of the at least two electrodes.

In an embodiment, each of the at least two pin electrodes comprises at least one groove; and each of the at least two extended electrodes comprises at least one conductive bump cooperated with the at least one groove on each of the at least two pin electrodes.

In an embodiment, each of the at least two extended electrodes further comprises a conductive body, and the at least one conductive pillar and the at least one conductive bump on each of the at least two extended electrodes are respectively disposed at two ends of the conductive body.

In an embodiment, the semiconductor chip is a two-terminal device, the at least two electrodes comprise a first electrode and a second electrode, and the at least two extended electrodes comprise: a first extended electrode corresponding to the first electrode, the first extended electrode comprising at least one first conductive pillar for inserting into the at least one electrode opening formed on the first electrode, and at least one first conductive bump cooperated with at least one groove arranged on a pin electrode corresponding to the first electrode; and a second extended electrode corresponding to the second electrode, the second extended electrode comprising at least one second conductive pillar for inserting into the at least one electrode opening formed on the second electrode, and at least one second conductive bump cooperated with at least one groove arranged on a pin electrode corresponding to the second electrode.

In an embodiment, the at least two pin electrodes comprise a first pin electrode and a second pin electrode respectively corresponding to the first electrode and the second electrode, and the first pin electrode and the second pin electrode are respectively arranged at opposite ends of the packaging chassis.

In an embodiment, the semiconductor chip is a three-terminal device, the at least two electrodes comprise a source electrode, a drain electrode and a gate electrode, and the at least two extended electrodes comprise: a first extended electrode corresponding to the source electrode, the first extended electrode comprising at least one first conductive pillar for inserting into the at least one electrode opening formed on the source electrode, and at least one first conductive bump cooperated with at least one groove arranged on a pin electrode corresponding to the source electrode; a second extended electrode corresponding to the drain electrode, the second extended electrode comprising at least one second conductive pillar for inserting into the at least one electrode opening formed on the drain electrode, and at least one second conductive bump cooperated with at least one groove arranged on a pin electrode corresponding to the drain electrode; and a third extended electrode corresponding to the gate electrode, the third extended electrode comprising at least one third conductive pillar for inserting into the at least one electrode opening formed on the gate electrode, and at least one third conductive bump cooperated with at least one groove arranged on a pin electrode corresponding to the gate electrode.

In an embodiment, the at least two pin electrodes comprise a first pin electrode corresponding to the source electrode, a second pin electrode corresponding to the drain electrode, and at least one third pin electrode corresponding to the gate electrode, and the at least one third pin electrode is located at two ends corresponding to the gate electrode on the packaging chassis.

In an embodiment, the at least one groove is a groove with an arc-shaped bottom; and the at least one conductive bump is a bump matched with a curvature of the groove with the arc-shaped bottom.

In an embodiment, the at least one conductive bump comprises a plurality of bumps arranged at equal intervals, and the at least one groove is a plurality of blind holes which matched with the plurality of bumps.

In an embodiment, the at least one conductive bump comprises a plurality of bumps arranged in a plurality of columns, the number of bumps arranged in each column is different, and the at least one groove is a plurality of blind holes which matched with the plurality of bumps.

In an embodiment, each of the at least two electrodes comprises a plurality of electrode openings, the plurality of electrode openings are arranged at equal intervals or in a plurality of columns; and each of the at least two extended electrodes comprises a plurality of conductive pillars, the plurality of conductive pillars are arranged in a same pattern corresponding to the plurality of electrode openings on each of the at least two electrodes.

In an embodiment, the plurality of electrode openings are chamfered rectangular parallelepiped holes; and the plurality of conductive pillars corresponding to the plurality of electrode openings are chamfered rectangular parallelepiped pillars matched with the shape of the plurality of electrode openings.

In an embodiment, the at least one conductive pillar is a metal pillar pre-made in the at least one electrode opening, and at least one blind hole matched with the at least one metal pillar is formed on each of the at least two extended electrodes.

In an embodiment, the semiconductor packaging structure further comprises a chip holding groove for accommodating the semiconductor chip and a radiator fin disposed at a bottom of the chip holding groove.

In an embodiment, the radiator fin is a planar monolithic radiator fin or a heat sink formed of longitudinal multi-piece radiator fins.

Another aspect of the present disclosure provides a semiconductor device which comprises a semiconductor chip and a semiconductor packaging structure for packaging the semiconductor chip, the semiconductor chip comprises at least two electrodes, each of the at least two electrodes comprises at least one electrode opening, and the packaging structure comprises: a packaging chassis, provided with at least two pin electrodes respectively corresponding to the at least two electrodes; and at least two extended electrodes, each of the at least two extended electrodes being electrically connected to one of the at least two pin electrodes, and comprising at least one conductive pillar for inserting into the at least one electrode opening formed on one of the at least two electrodes.

In an embodiment, each of the at least two pin electrodes comprises at least one groove; and each of the at least two extended electrodes comprises at least one conductive bump cooperated with the at least one groove on each of the at least two pin electrodes.

In an embodiment, the semiconductor device further comprises a passivation dielectric layer covering an upper surface of the semiconductor chip, the at least one electrode opening passes through the passivation dielectric layer.

In an embodiment, the semiconductor device further comprises a protective dielectric layer disposed on the packaging chassis for covering a region other than the at least two pin electrodes, the protective dielectric layer comprises at least one through hole corresponding to the at least one electrode opening.

In an embodiment, an upper surface of the protective dielectric layer is flush with an upper surface of the at least two pin electrode.

The semiconductor package structure according to the embodiments of the present invention connects the semiconductor chip and the pin electrodes through the electrode openings on the semiconductor chip and the conductive pillars and the conductive bumps on the extended electrodes. The connection between the semiconductor chip and the pin electrodes can be realized without using a lead wire, thereby effectively avoiding the parasitic inductance introduced by the wire bonding connection, improving the situation that the signal oscillation is intensified under the high frequency working condition caused by the parasitic inductance, and further improving the quality of the electrical signal transmission of the high frequency device. The method of seamless connection of the conductive pillars and the conductive bumps with the corresponding electrodes and pin electrodes on the semiconductor chip respectively expands the electrical connection contact area, reduces the contact resistance between the electrodes, and realizes a reliable electrical connection. At the same time, the extended electrode can improve the extraction path of heat generated during the operation of the semiconductor chip, reduce the temperature rise of the semiconductor chip, and enhance the use efficiency and reliability of the semiconductor device. In addition, a packaging mold may also be customized according to the size of the semiconductor chip by using the packaging technology according to the embodiments of the present disclosure, and thus the packaging volume of the semiconductor device may be effectively reduced, and the miniaturization of the application of the semiconductor device module may be realized.

BRIEF DESCRIPTION OF DRAWINGS

To more clearly describe the technical solution in embodiments of the present disclosure, accompanying drawings needed to be used in the embodiments will be briefly described below. It should be understood that the following drawings below merely show some embodiments of the present disclosure and thus cannot be considered as limitations to the scope. Those skilled in the art can also obtain other relevant drawings according to these drawings without paying any creative effort.

DESCRIPTIONS OF REFERENCE SIGNS

Figure 1:
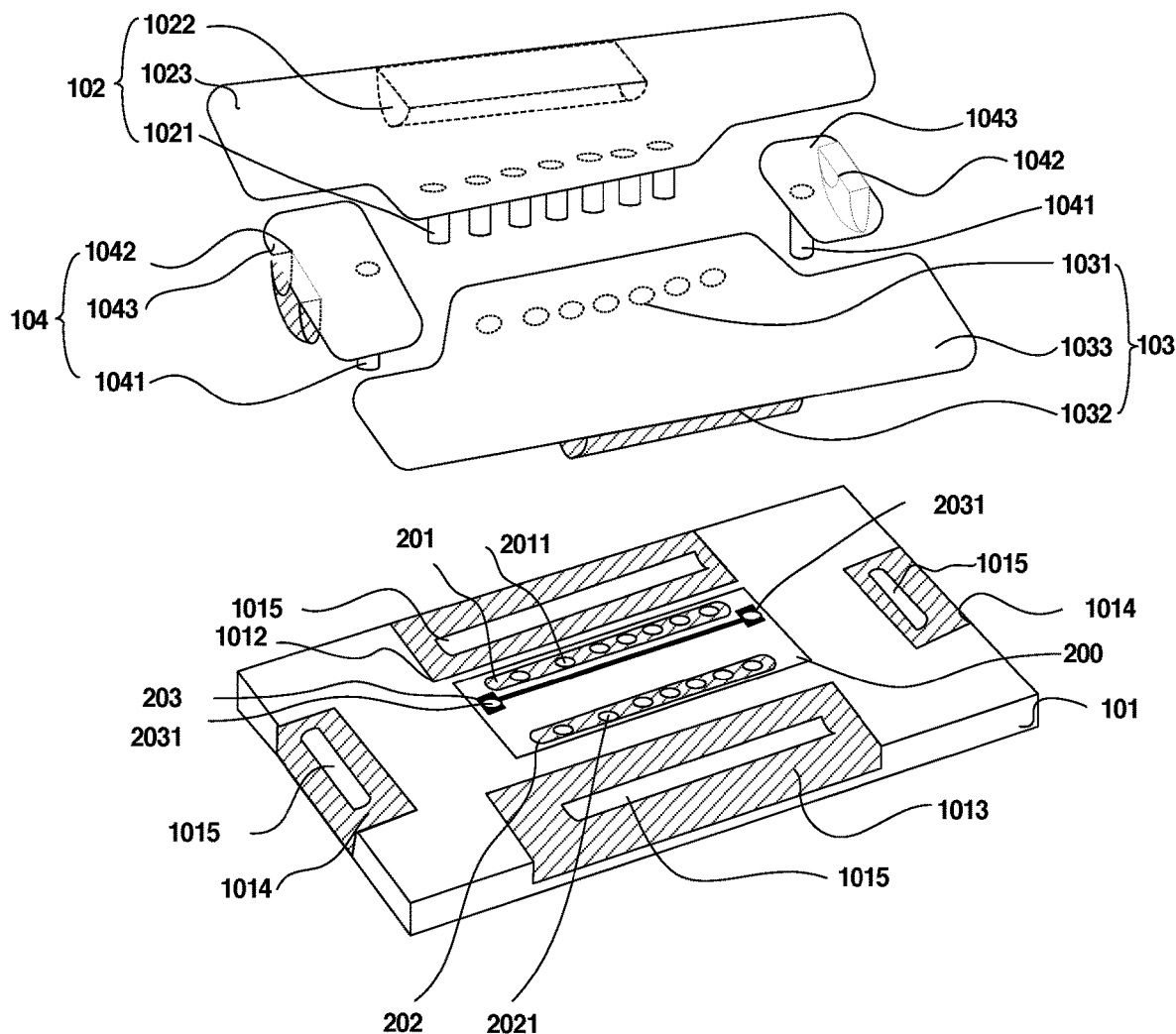
FIG. 1 is a schematic structural diagram illustrating a semiconductor packaging structure according to an embodiment of the present disclosure.

| | |
|---|---|
| 100, 300 - semiconductor packaging structure | 200, 400 - semiconductor chip |
| 201 - source electrode | 2011 - source electrode opening |
| 202 - drain electrode | 2021 - drain electrode opening |
| 203 - gate electrode | 2031 - gate electrode opening |
| 204 - passivation dielectric layer | 101, 301 - packaging chassis |
| 1011 - chip holding groove | 1012, 2012 - first pin electrode |
| 1013, 2013 - second pin electrode | 1014 - third pin electrode |
| 1015, 2015 - groove | 102, 302 - first extended electrode |
| 1021, 3021 - first conductive pillar | 1022, 3022 - first conductive bump |
| 1023, 3023 - first conductive body | 103, 303 - second extended electrode |
| 1031, 3031 - second conductive pillar | 1032, 3032 - second conductive bump |
| 1033, 3033 - second conductive body | 104 - third extended electrode |
| 1041 - third conductive pillar | 1042 - third conductive bump |
| 1043 - third conductive body | 105 - radiator fin |
| 106, 306 - protective dielectric layer | 401 - first electrode |
| 402 - second electrode | 4011 - first electrode opening |
| 4021 - second electrode opening | 5042, 6022, 6032, 6042 - conductive bump |
| 5015 - rectangular blind hole | 6015 - cylindrical blind hole |
| 7500 - metal pillar | 7021 - blind hole |
| 8105 - heat sink | |

DETAILED DESCRIPTION

In the following detailed description, technical schemes in embodiments of the present disclosure will be clearly described with reference to the accompanying drawings in the embodiments. Apparently, the described embodiments are only a part of the embodiments of the present disclosure, but not all of the embodiments. Components of the embodiments of the present disclosure, described and illustrated in the accompanying drawings herein, may be arranged and designed in various different configurations.

Therefore, the following detailed descriptions for the embodiments of the present disclosure provided in the accompanying drawings are not intended to limit the scope of the present disclosure, but merely indicate selected embodiments of the present disclosure. All other embodiments obtained by those skilled in the art based on the embodiments of the present disclosure without creative efforts will fall within the protection scope of the present disclosure.

It should be noted that similar reference symbols and letters denote similar items in the accompanying drawings, and therefore, once an item is defined in an accompanying drawing, it need not be further defined and interpreted in subsequent accompanying drawings. In the description of the present disclosure, terms "first", "second", "third", "fourth" and so on are merely used to distinguish a description, and cannot be understood as an indication or implication of relative importance.

Embodiments of the present disclosure provide a semiconductor packaging structure for packaging a semiconductor chip. The semiconductor chip includes at least two electrodes, each electrode is fabricated with at least one corresponding electrode opening. The packaging structure includes a packaging chassis and at least two extended electrodes. The packaging chassis is provided with pin electrodes respectively corresponding to the at least two electrodes of the semiconductor chip. Each extended electrode is electrically connected to one of the pin electrodes, and includes conductive pillars for inserting into electrode openings formed on an electrode.

In an embodiment, at least one groove is formed on the pin electrode; and a conductive bump is formed on the extended electrode, and the conductive bump is matched with the groove on the pin electrode to realize electrical connection between the extended electrode and the pin electrode.

For the semiconductor chip, it can be a two-terminal device (such as a diode) or a three-terminal device (such as a triode and a transistor), which will be described in detail below through different embodiments.

Figure 2:
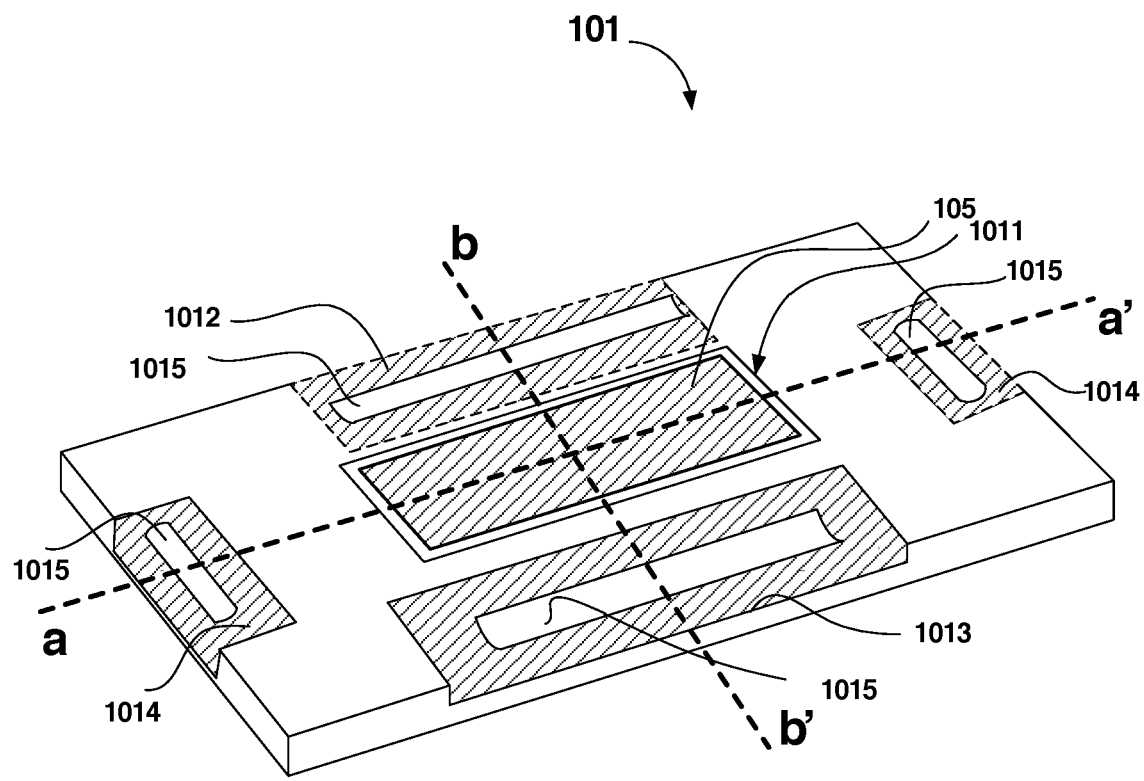
FIG. 2 is a schematic structural diagram illustrating a packaging chassis in a semiconductor packaging structure according to an embodiment of the present disclosure.

Firstly, taking the three-terminal device as an example, as shown in FIGS. 1-2, an embodiment of the present disclosure provides a semiconductor packaging structure 100 for packaging a semiconductor chip 200. The at least two electrodes of the semiconductor chip 200 include a source electrode 201, a drain electrode 202, and a gate electrode 203. The source electrode 201, the drain electrode 202 and the gate electrode 203 are respectively formed with electrode openings. The semiconductor packaging structure 100 includes a packaging chassis 101 and at least two extended electrodes, and the semiconductor chip 200 is housed in the packaging chassis 101.

Figure 3:
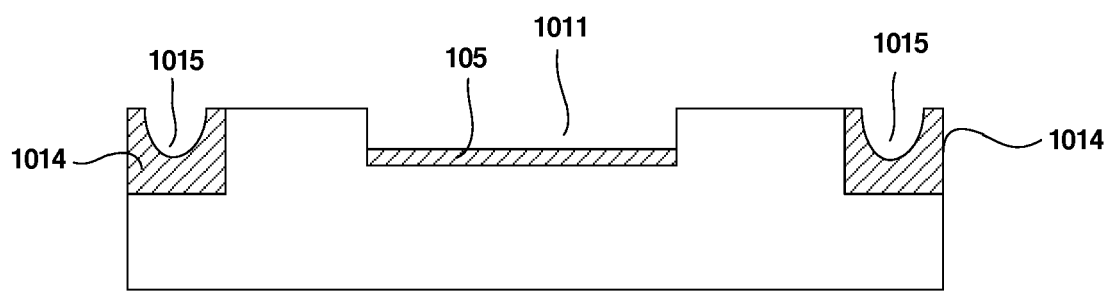
FIG. 3 is a schematic cross-sectional view illustrating the direction of aa' show in FIG. 2.
Figure 4:
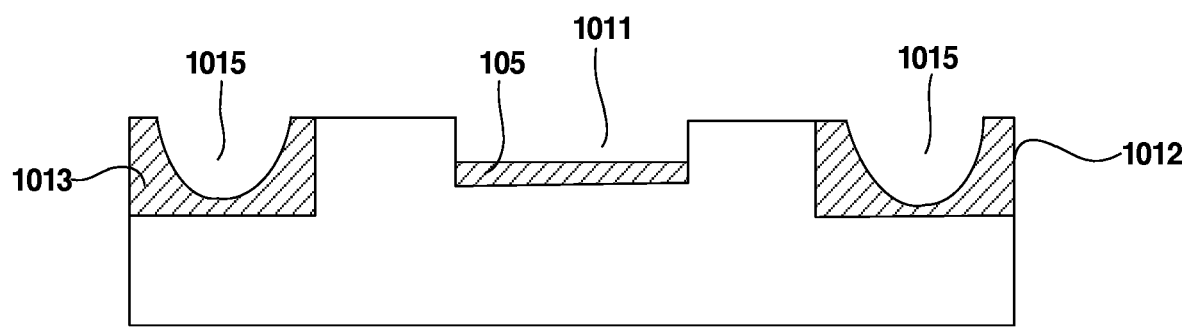
FIG. 4 is a schematic cross-sectional view illustrating the direction of bb' show in FIG. 2.

The packaging chassis 101 is provided with a plurality of pin electrodes respectively corresponding to the source electrode 201, the drain electrode 202 and the gate electrode 203, and a chip holding groove 1011 for accommodating the semiconductor chip 200 (referring FIGS. 3-4). At least one groove 1015 is made on a pin electrode. In an embodiment, a pin electrode corresponding to the source electrode 201 is a first pin electrode 1012, a pin electrode corresponding to the drain electrode 202 is a second pin electrode 1013, and a pin electrode corresponding to the gate electrode 203 is a third pin electrode 1014.

Each extended electrode includes conductive pillars for inserting into the electrode openings opened on the source electrode 201, the drain electrode 202 or the gate electrode 203, and a conductive bump cooperated with a groove 1015 arranged on a pin electrode corresponding to the source electrode 201, the drain electrode 202 or the gate electrode 203. In detail, in an embodiment, the at least two extended electrodes include a first extended electrode 102, a second extended electrode 103 and a third extended electrode 104.

For the semiconductor material of the semiconductor chip 200, a semiconductor material such as gallium nitride, silicon carbide, silicon, diamond, gallium arsenide and the like may be selected, which is not limited by the embodiments of the present disclosure. The shape and size of the chip holding groove 1011 can be determined according to the specific shape of the semiconductor chip 200. Optionally, the length and width of the chip holding groove 1011 are 0 to 5% larger than the length and width of the semiconductor chip 200.

The position and number of the electrode opening formed on the semiconductor chip 200 can be determined according to the specific structure of the chip. In some specific embodiments, a plurality of electrode openings may be formed on the source electrode 201 and the drain electrode 202, and one or more electrode openings may be respectively formed at both ends of the gate electrode line on the gate electrode 203. In a specific embodiment, as shown in FIG. 1, two electrode openings are formed on the gate electrode 203, and are respectively formed at both ends of the gate electrode line.

The shape of the electrode opening can be circular or other shapes. In an embodiment, the electrode opening is a chamfered rectangular parallelepiped hole; and the conductive pillar corresponding to the electrode opening is a chamfered rectangular parallelepiped pillar matched with the shape of the electrode opening.

It can be understood that the electrode openings on the semiconductor chip 200 may include source electrode openings 2011 formed on the source electrode 201, drain electrode openings 2021 formed on the drain electrode 202, and gate electrode openings 2031 formed on the gate electrode 203. Preferably, the plurality of electrode openings formed on each electrode are arranged at equally intervals or in a plurality of columns on the electrode; correspondingly, the plurality of conductive pillars on the extended electrode are arranged in the same manner as the electrode openings on the chip electrode.

The source electrode 201 and the drain electrode 202 of the semiconductor chip 200 are located at both ends, and the gate electrode 203 is located between the source electrode 201 and the drain electrode 202. Correspondingly, the first pin electrode 1012 and the second pin electrode 1013 are each one and located at opposite ends of the packaging chassis 101, the first pin electrode 1012 is disposed near the source electrode 201, and the second pin electrode 1013 is disposed near the drain electrode 202. The number of the third pin electrode 1014 may be two, and they are respectively located at two other ends of the packaging chassis 101.

Optionally, the groove 1015 on the pin electrode is a groove with an arc-shaped bottom, and the depth of the groove is no more than the thickness of the pin electrode. As shown in FIGS. 3-4, the depth of the groove 1015 is less than the thickness of the pin electrode at which the groove is located. The conductive bump is a bump matched with the curvature of the groove 1015 with an arc-shaped bottom.

Referring to FIG. 1, the first extended electrode 102 includes first conductive pillars 1021 for inserting into the source electrode openings 2011 formed on the source electrode 201, and a first conductive bump 1022 cooperated with the groove 1015 arranged on the first pin electrode 1012 corresponding to the source electrode 201. In addition, the first extended electrode 102 further includes a first conductive body 1023, and the first conductive pillars 1021 and the first conductive bump 1022 are respectively disposed at two ends of the first conductive body 1023. In an embodiment, the first conductive body 1023 may be in a sheet or other shape.

The shape of the first conductive pillar 1021 on the first extended electrode 102 may be a cylindrical or other shape, and its shape matches the shape of the electrode opening on the source electrode 201. The first conductive pillar 1021 is electrically connected to the source electrode 201 after being inserted into the source electrode opening 2011. The number of the first conductive pillar 1021 is matched with the number of the source electrode opening 2011. The source electrode opening 2011 may be disposed in plurality. After the plurality of first conductive pillars 1021 are inserted into the corresponding source electrode openings 2011, the electrical connection between the first extended electrode 102 and the source electrode 201 can be realized.

The shape of the first conductive bump 1022 on the first extended electrode 102 matches the shape of the groove 1015 formed on the first pin electrode 1012. For example, the groove 1015 on the first pin electrode 1012 may be an ellipsoidal groove 1015, the first conductive bump 1022 is a bump that can be inserted into the ellipsoidal groove 1015, and the electrical connection between the first extended electrode 102 and the first pin electrode 1012 can be realized after the first conductive bump 1022 being inserted into the groove 1015 on the first pin electrode 1012. That is, the source electrode 201 of the semiconductor chip 200 and the first pin electrode 1012 of the packaging chassis 101 can be connected by the first conductive pillars 1021 and the first conductive bump 1022 disposed on the first extended electrode 102.

The second extended electrode 103 includes second conductive pillars 1031 for inserting into the drain electrode openings 2021 formed on the drain electrode 202, and a second conductive bump 1032 cooperated with the groove 1015 arranged on the second pin electrode 1013 corresponding to the drain electrode 202. In addition, the second extended electrode 103 further includes a second conductive body 1033, and the second conductive pillars 1031 and the second conductive bump 1032 are respectively disposed at two ends of the second conductive body 1033. The shape of the second conductive body 1033 may be in a sheet or other shape.

Similar to the structure of the first extended electrode 102, the second extended electrode 103 connects the drain electrode 202 and the second pin electrode 1013 through the second conductive pillars 1031 and the second conductive bump 1032. The number and shape of the second conductive pillars 1031 are matched with the number and shape of the drain electrode openings 2021. The shape of the second conductive bump 1032 is matched with the shape of the groove 1015 on the second pin electrode 1013.

The third extended electrode 104 includes a third conductive pillar 1041 for inserting into a gate electrode opening 2031 formed on the gate electrode 203, and a third conductive bump 1042 cooperated with a groove 1015 arranged on a third pin electrode 1014 corresponding to the gate electrode 203. In addition, the third extended electrode 104 further includes a third conductive body 1043, and the third conductive pillar 1041 and the third conductive bump 1042 are respectively disposed at two ends of the third conductive body 1043. The shape of the third conductive body 1043 may be in a sheet or other shape.

As described above, the gate electrode opening 2031 on the gate electrode 203 may be two, and the third pin electrode 1014 may also be two. Correspondingly, the third extended electrode 104 may also be two, and the two third extended electrodes 104 respectively connect the two gate electrode openings 2031 with the corresponding third pin electrodes 1014. When the gate electrode openings 2031 are two, the third conductive pillar 1041 on each third extended electrode 104 may be one and may be inserted into a gate electrode opening 2031. The third conductive bump 1042 on each third extended electrode 104 is matched with the groove 1015 on each third pin electrode 1014, and thereby the connection between the gate electrode 203 and the third pin electrodes 1014 is realized through the third extended electrodes 104.

The shapes of the first conductive body 1023, the second conductive body 1033, and the third conductive bodies 1043 may match each other, but do not contact each other, and a predetermined distance is reserved between the two. The first conductive body 1023, the second conductive body 1033, and the third conductive bodies 1043 may have a thickness of 100 um to 5000 um. The material of the first conductive body 1023, the second conductive body 1033, and the third conductive bodies 1043 may be a metal with a low resistivity such as Cu, Ag, Al, and so on.

The material of the first conductive pillar 1021, the second conductive pillar 1031 and the third conductive pillar 1041 may be a metal with a low resistivity such as Cu, Ag, Al, and so on.

The material of the first conductive bump 1022, the second conductive bump 1032, and the third conductive bump 1042 may be a metal with a low resistivity such as Cu, Ag, Al, and so on. The curvature of the first conductive bump 1022, the second conductive bump 1032 and the third conductive bump 1042 may be consistent with the curvature of the corresponding grooves 1015. Seamless contact may be realized when the first conductive bump 1022, the second conductive bump 1032 and the third conductive bump 1042 are placed in the corresponding grooves 1015.

In the process of packaging the semiconductor chip 200, the semiconductor chip 200 is placed in the chip holding groove 1011, the conductive pillars on the corresponding extended electrodes are inserted into the corresponding electrode openings, and the conductive bumps are placed in the grooves 1015 of corresponding pin electrodes. Finally, a complete semiconductor packaging device may be formed by using a plastic sealing process to package the whole device.

According to the embodiments of the present disclosure, the source electrode 201, the drain electrode 202, and the gate electrode 203 are respectively connected with the corresponding pin electrodes through the first conductive pillars 1021 and the first conductive bump 1022 on the first extended electrode 102, the second conductive pillars 1031 and the second conductive bump 1032 on the second extended electrode 103, and the third conductive pillars 1041 and the third conductive bumps 1042 on the third extended electrodes 104. The connection between the semiconductor chip and the pin electrodes can be realized without using a lead wire, thereby effectively avoiding the parasitic inductance introduced by the wire bonding connection, improving the situation that the signal oscillation is intensified under the high frequency working condition caused by the parasitic inductance, and further improving the quality of the electrical signal transmission of the high frequency device. The method of seamless connection of the conductive pillars and the conductive bumps with the corresponding electrodes and pin electrodes on the semiconductor chip respectively expands the electrical connection contact area, reduces the contact resistance between the electrodes, and realizes a reliable electrical connection. In addition, the extended electrode can improve the extraction path of heat generated during the operation of the semiconductor chip, reduce the temperature rise of the semiconductor chip, and enhance the use efficiency and reliability of the semiconductor device.

Figure 5:
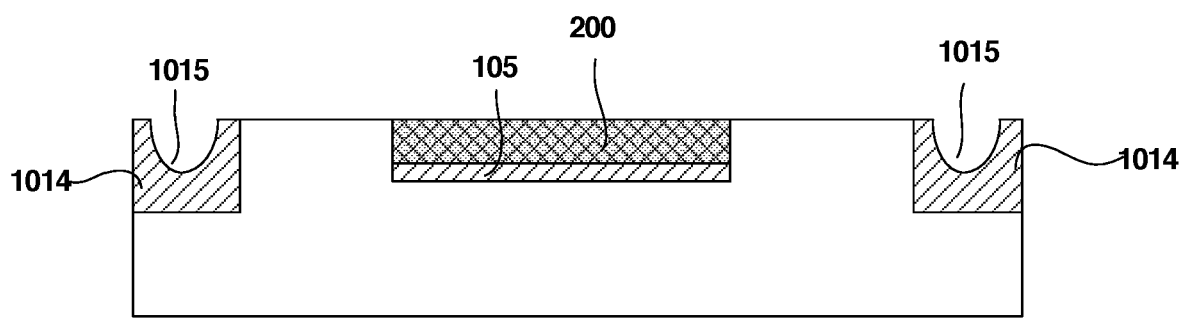
FIG. 5 is a schematic cross-sectional view illustrating a semiconductor packaging structure according to an embodiment of the present disclosure.

In some specific embodiments, as shown in FIG. 5, a radiator fin 105 is further disposed in the chip holding groove 1011. The radiator fin 105 may be disposed at the bottom of the chip holding groove 1011, and the bottom of the chip holding groove 1011 may be completely or partially covered by the radiator fin 105. The specific length and width dimensions of the radiator fin 105 may be determined according to the actual size of the chip holding groove 1011. When the semiconductor chip 200 is placed in the chip holding groove 1011, the semiconductor chip 200 may be fixed on the radiator fin 105 by conductive or gold-tin soldering materials.

The thickness of the radiator fin 105 may be determined according to actual conditions. Optionally, the sum of the thickness of the radiator fin 105 and the thickness of the semiconductor chip 200 is consistent with the depth of the chip holding groove 1011. After the semiconductor chip 200 is fixed on the radiator fin 105 in the chip holding groove 1011, the upper surface of the semiconductor chip 200 is flush with the upper surface of the chip holding groove 1011. In a specific embodiment, the thickness of the radiator fin 105 may be 10 um to 5000 um.

The material of the radiator fin 105 may be metal materials, such as Cu, Al, Ag and other metals or alloys, or a material such as diamond, silicon carbide, graphite with a high thermal conductivity.

The heat generated by the semiconductor chip 200 can be transmitted to the radiator fin 105 by disposing the radiator fin 105, and thus the heat dissipation of the semiconductor chip 200 may be speed up, the tolerance to temperature of the semiconductor chip 200 may be better, the temperature rise of the semiconductor chip 200 may be reduced, and the working environment of the semiconductor chip 200 may be better.

Figure 6:
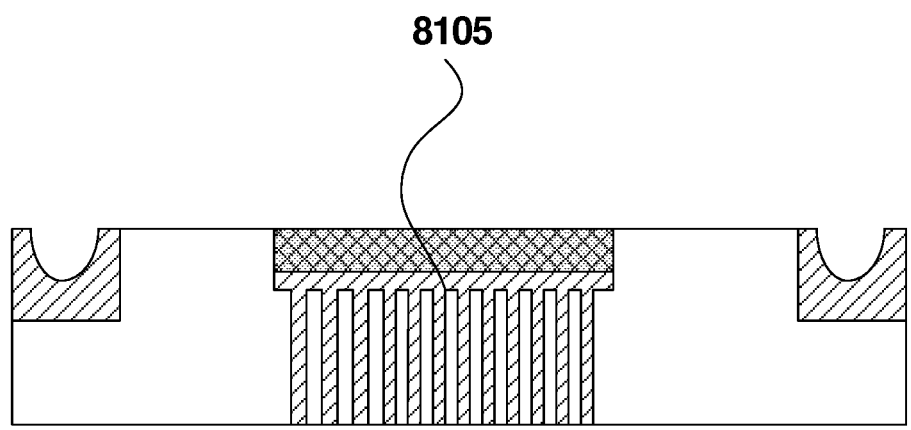
FIG. 6 is a schematic cross-sectional view illustrating a semiconductor packaging structure according to another embodiment of the present disclosure.

In an embodiment, as shown in FIG. 6, the radiator fin may be a planar monolithic radiator fin or a heat sink 8105 formed of longitudinal multi-piece radiator fins. Compared with the planar monolithic radiator fin, the heat sink 8105 may further expand the heat dissipation area, and improve the heat dissipation capability of the semiconductor chip 200.

The semiconductor chip in the embodiments of the present disclosure may be a planar structure device or a vertical structure device. The upper surface of the semiconductor chip 200 may also be covered by other materials. The depth of the electrode opening may be determined according to the depth of the covering material, and the bottom of the electrode opening is in contact with the source electrode 201, the drain electrode 202 or the gate electrode 203, or the bottom of the electrode opening may be located within the source electrode 201, the drain electrode 202 or the gate electrode 203. After the first conductive pillar 1021, the second conductive pillar 1031, and the third conductive pillar 1041 are inserted into the electrode openings, the conductive pillars may maintain good surface contact with the corresponding electrodes, and thereby the reliability of the connection between the source electrode 201, the drain electrode 202 or the gate electrode 203 and the corresponding pin electrode may be ensured.

Figure 7:
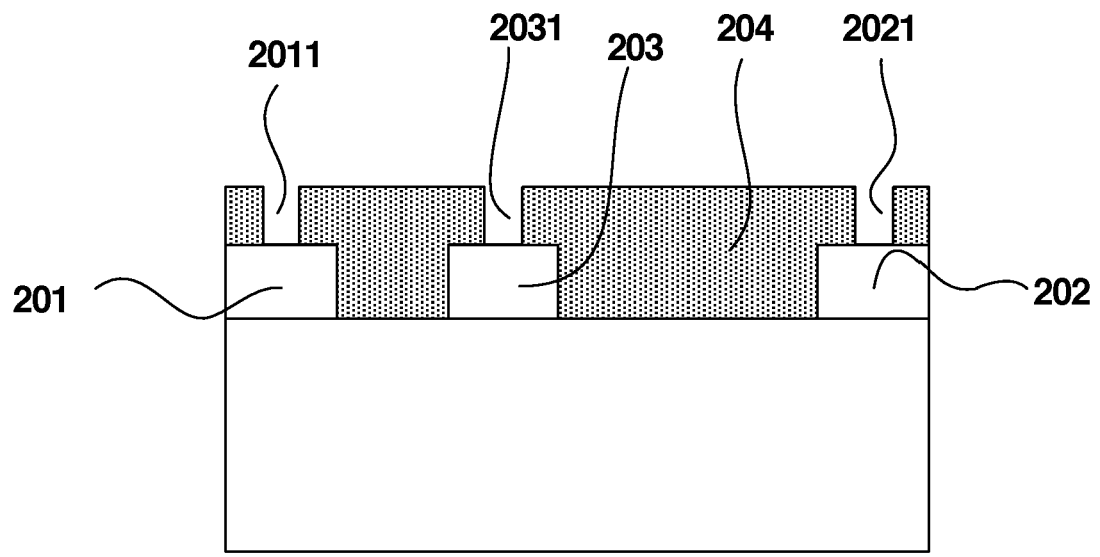
FIG. 7 is a schematic cross-sectional view illustrating a semiconductor chip according to an embodiment of the present disclosure.
Figure 8:
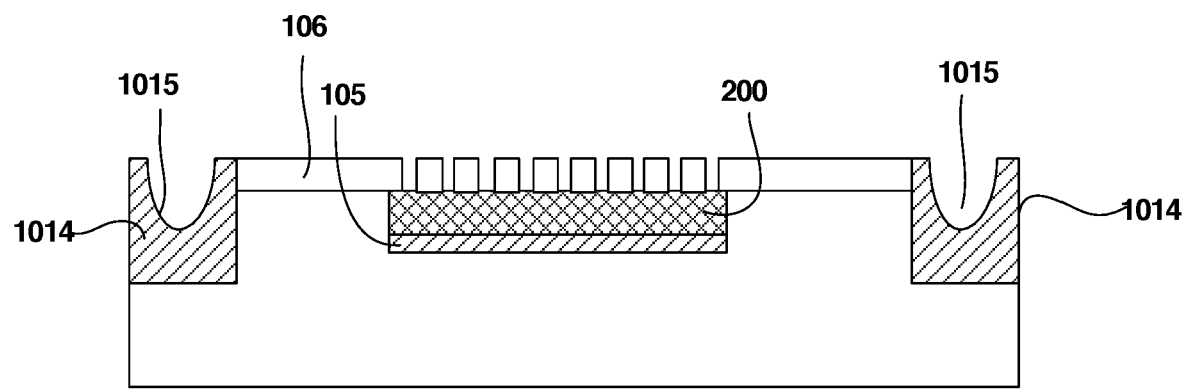
FIG. 8 is a schematic cross-sectional view illustrating the cooperation of a packaging chassis and a semiconductor chip in a semiconductor packaging structure according to an embodiment of the present disclosure.
Figure 9:
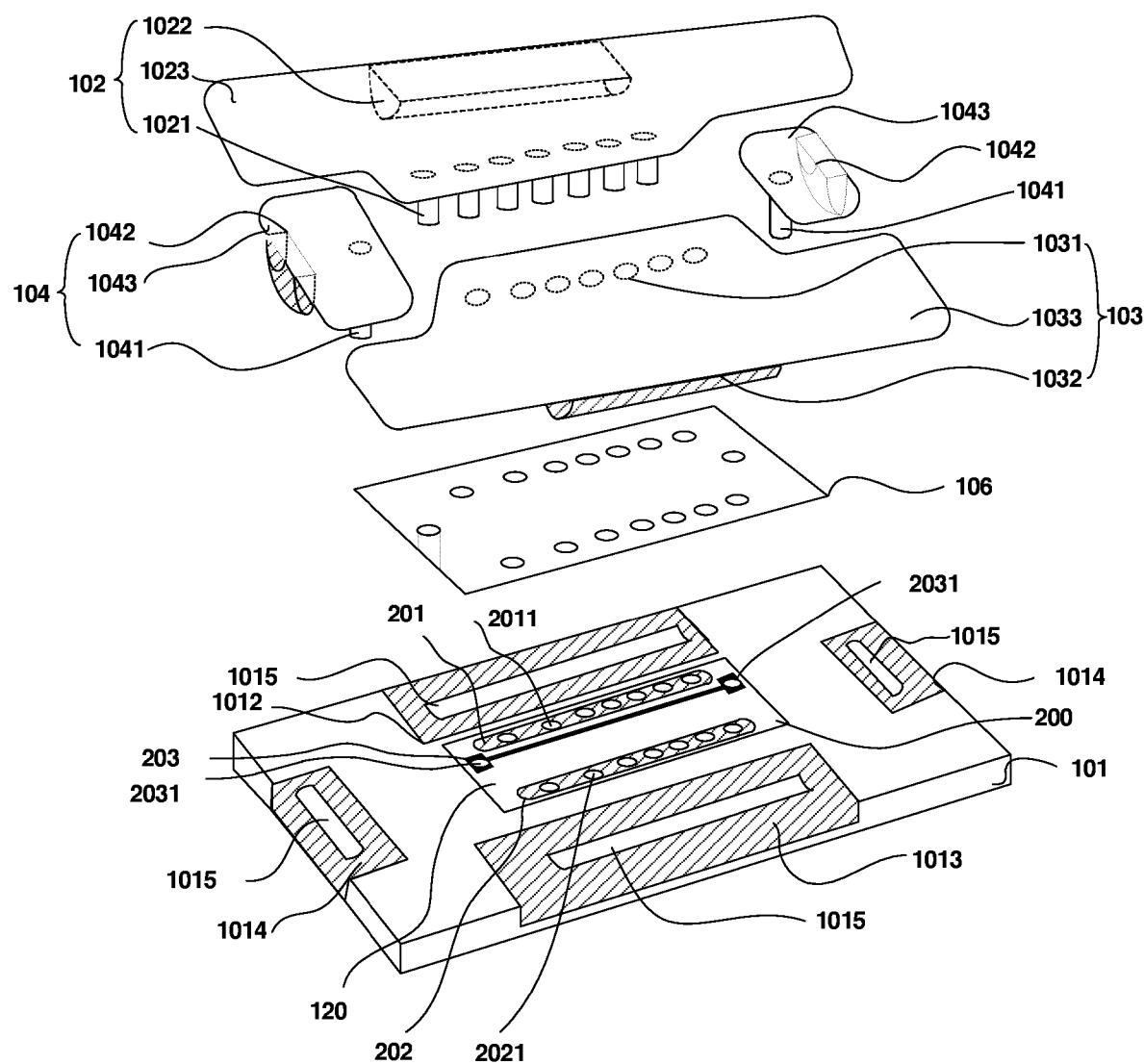
FIG. 9 is a schematic structural diagram illustrating a semiconductor packaging structure according to another embodiment of the present disclosure.
Figure 10:
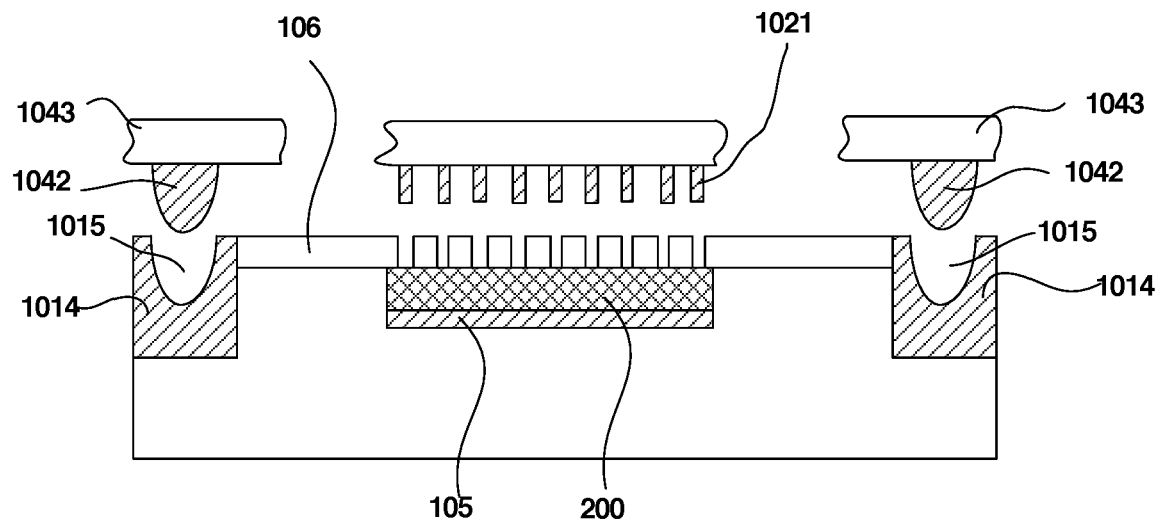
FIG. 10 is a schematic cross-sectional view illustrating a semiconductor packaging structure according to an embodiment of the present disclosure.
Figure 11:
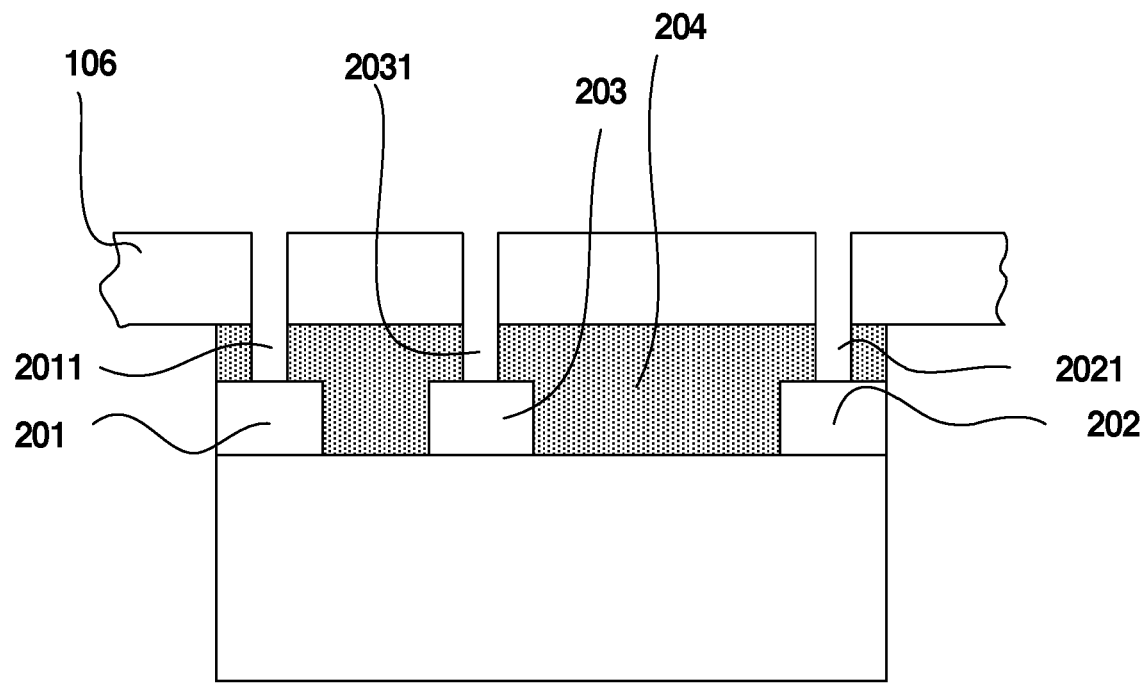
FIG. 11 is a schematic cross-sectional view illustrating a semiconductor chip packaged in a semiconductor packaging structure according to an embodiment of the present disclosure.
Figure 12:
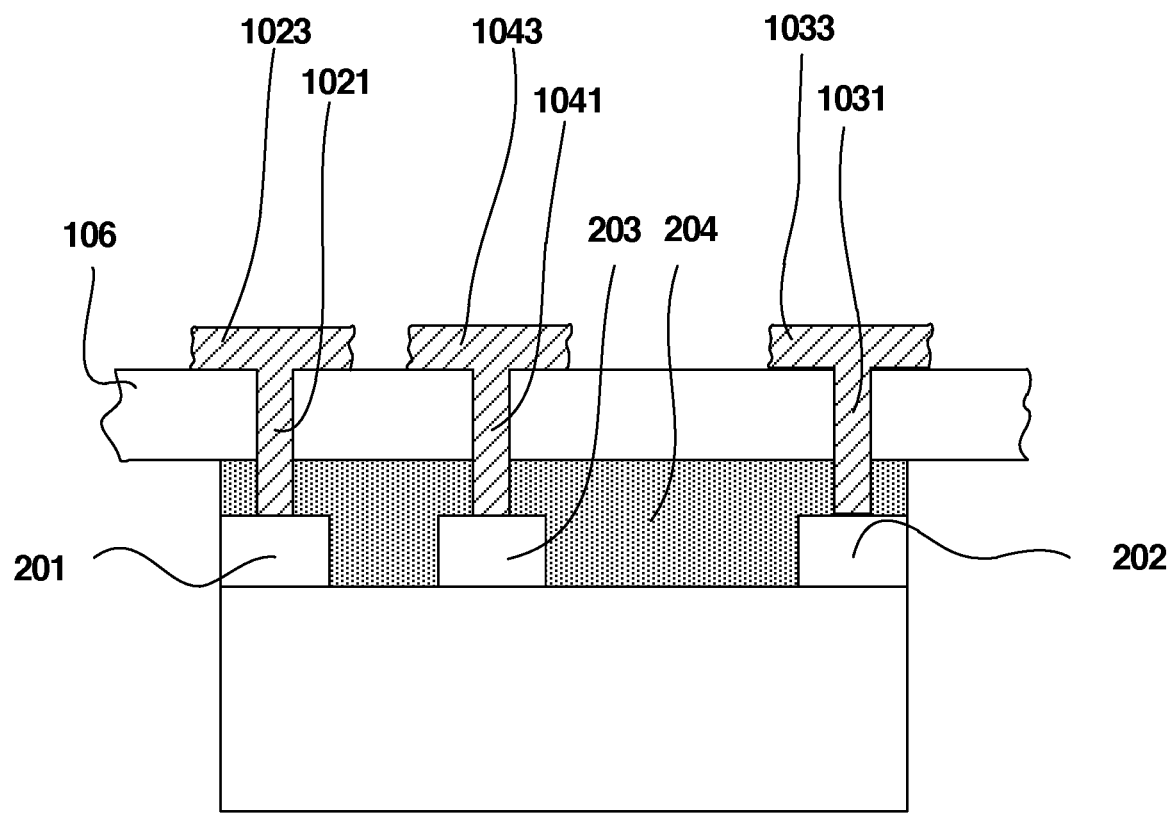
FIG. 12 is a schematic cross-sectional view illustrating a semiconductor packaging structure according to an embodiment of the present disclosure.

In some specific embodiments, as shown in FIG. 7, the upper surface of the semiconductor chip 200 is covered by a passivation dielectric layer 204. The material of the passivation dielectric layer 204 may be silicon nitride, silicon dioxide or other high dielectric constant materials with a vacuum dielectric constant greater than 7, and the thickness of the passivation dielectric layer 204 may be 0.5 um to 5 um. When the passivation dielectric layer 204 is covered on the semiconductor chip 200, the electrode opening is a blind hole which passes through the passivation dielectric layer 204, and the bottom is located on the surface or inside of the source electrode 201, the drain electrode 202, or the gate electrode 203. The damage to the surface of the chip may be reduced by providing the passivation dielectric layer 204, and at the same time, the electrode openings are formed in the passivation dielectric layer 204 directly above the electrodes, thereby achieving the self-alignment when the conductive pillars are inserted and improving the reliability of electrical connection of the semiconductor device.

In some specific embodiments, as shown in FIGS. 8-12, a protective dielectric layer 106 may also be disposed on the packaging chassis 101. The region other than the pin electrodes may be covered by the protective dielectric layer 106, and the semiconductor chip 200 placed in the chip holding groove 1011 may also be covered by the protective dielectric layer 106. It can be understood that the protective dielectric layer 106 may have through holes corresponding to the electrode openings. In the production process, the upper surface of the protective dielectric layer 106 may be flush with the upper surface of the pin electrodes. The protection of the semiconductor chip 200 may be realized by providing the protective dielectric layer 106 to prevent scratching or fracturing of the surface of the semiconductor chip 200 during assembly.

The material of the protective dielectric layer 106 may have high insulation and good thermal conductivity, and a material with a resistivity $\rho > 10^7$ $\Omega \cdot m$ may be selected. The protective dielectric layer 106 may be formed of materials satisfying the FR-4 grade. The protective dielectric layer 106 may be selected from materials with a breakdown voltage greater than 2000 V. In an embodiment, the thickness of the protective dielectric layer 106 may be 100 um to 1000 um.

Figure 13:
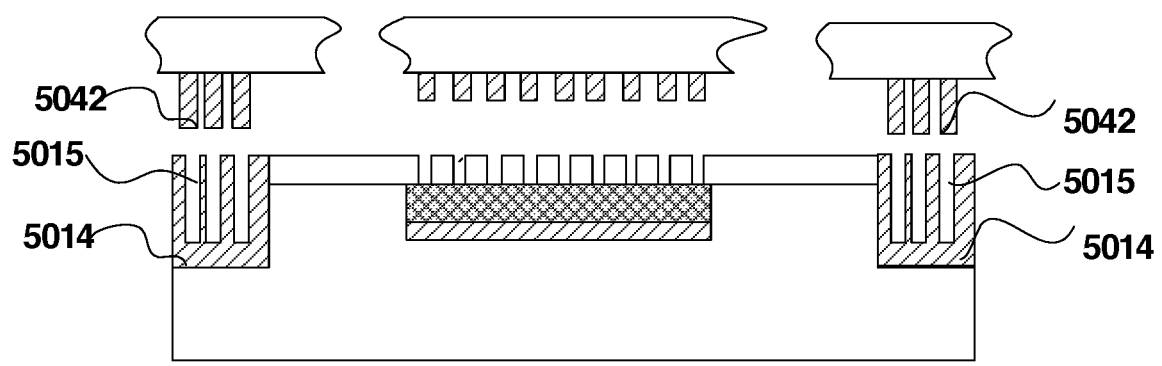
FIG. 13 is a schematic cross-sectional view illustrating a semiconductor packaging structure according to another embodiment of the present disclosure.
Figure 14:
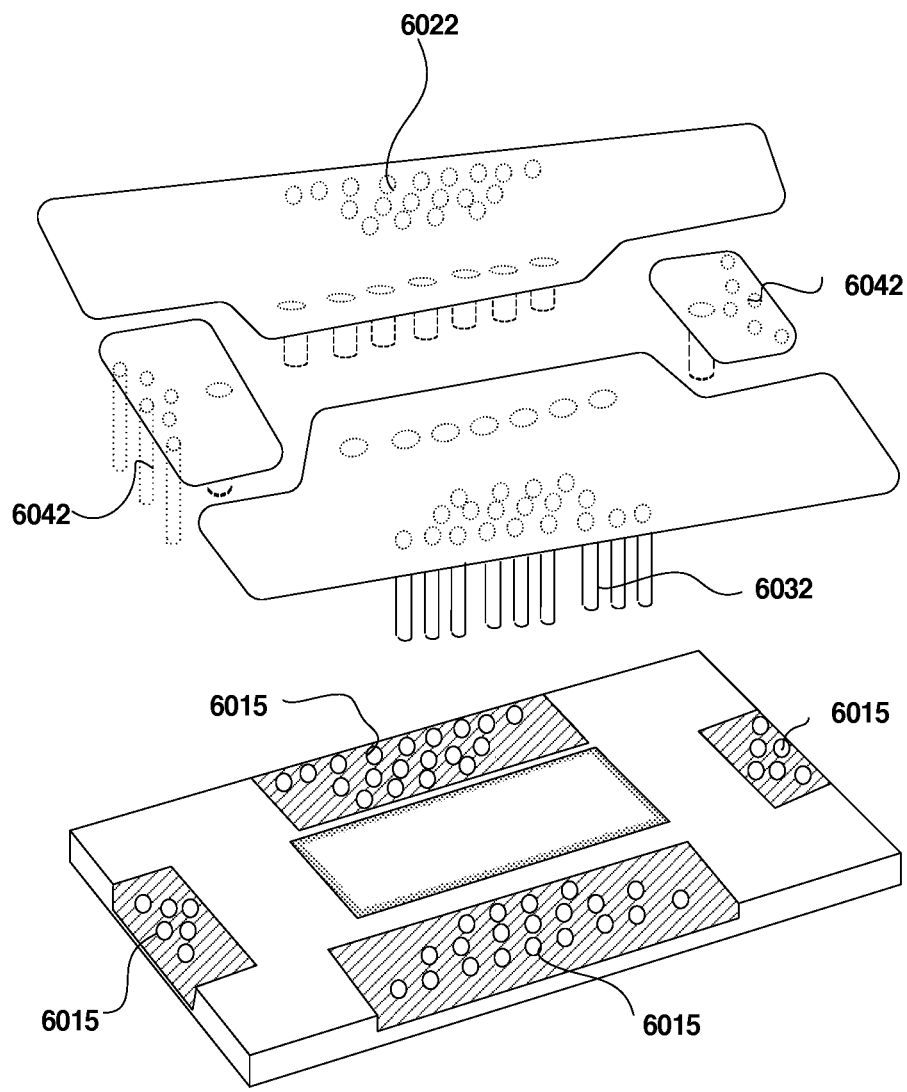
FIG. 14 is a schematic structural diagram illustrating a semiconductor packaging structure according to still another embodiment of the present disclosure.

In an embodiment, as shown in FIGS. 13-14, the conductive bumps 5042 (6022, 6032, 6042) on the extended electrode may be cylindrical or rectangular parallelepiped. The conductive bumps 5042 (6042) may include a plurality of bumps arranged in a plurality of columns, the plurality of bumps may be arranged incrementally or degressively in a predetermined direction; or the conductive bumps 5042 (6042) may be a plurality of bumps arranged at equal intervals. At the same time, rectangular parallelepiped blind holes 5015 or cylindrical blind holes 6015 matched with the plurality of bumps may be disposed on the pin electrode, so that the conductive bumps 5042 (6042) may be completely matched with the rectangular parallelepiped blind holes 5015 or the cylindrical blind holes 6015 to realize seamless electrical connection. The edge of the conductive bump 5042 (6042) and the bottom of the blind hole may be formed into a chamfered structure, which may better achieve seamless electrical connection and avoid the phenomenon of electrode tip discharge.

Figure 15:
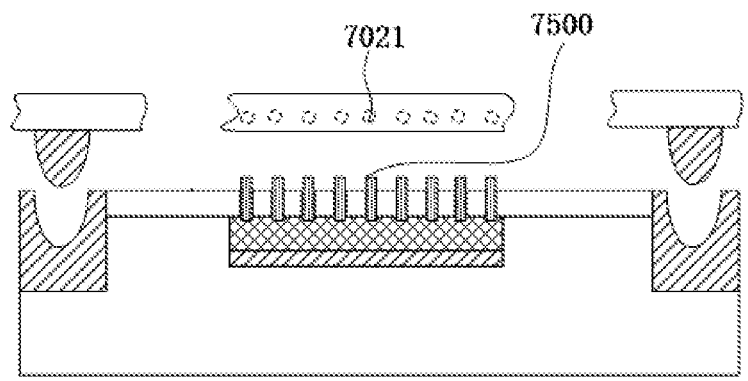
FIG. 15 is a schematic cross-sectional view illustrating a semiconductor packaging structure according to yet still another embodiment of the present disclosure.

In an embodiment, as shown in FIG. 15, the conductive pillars on the extended electrodes may be metal pillars 7500 made in the electrode openings and connected with the electrodes of the semiconductor chip. Correspondingly, blind holes 7021 matched with the conductive pillars may be opened on the extended electrodes, so that the metal pillars 7500 may be inserted into the blind holes to realize electrical connection. It can be understood that the metal pillars 7500 may be realized by evaporation, sputtering, electrodeposition and other processes, and the metal material may be selected from metals or alloys such as Au, Ag, Pt, Al, Ni, Ti, W.

When the protective dielectric layer 106 is formed on the semiconductor chip, through holes corresponding to the metal pillars 7500 may be opened on the protective dielectric layer 106, and the metal pillars 7500 may be connected with the electrodes through the protective dielectric layer 106. The height of the metal pillars 7500 may be equal to the sum of the depth of the electrode openings, the depth of the blind holes and the depth of the through holes in the protective dielectric layer.

The semiconductor packaging structure according to the embodiments of the present disclosure will be described in detail below by taking a two-terminal device as an example.

Figure 16:
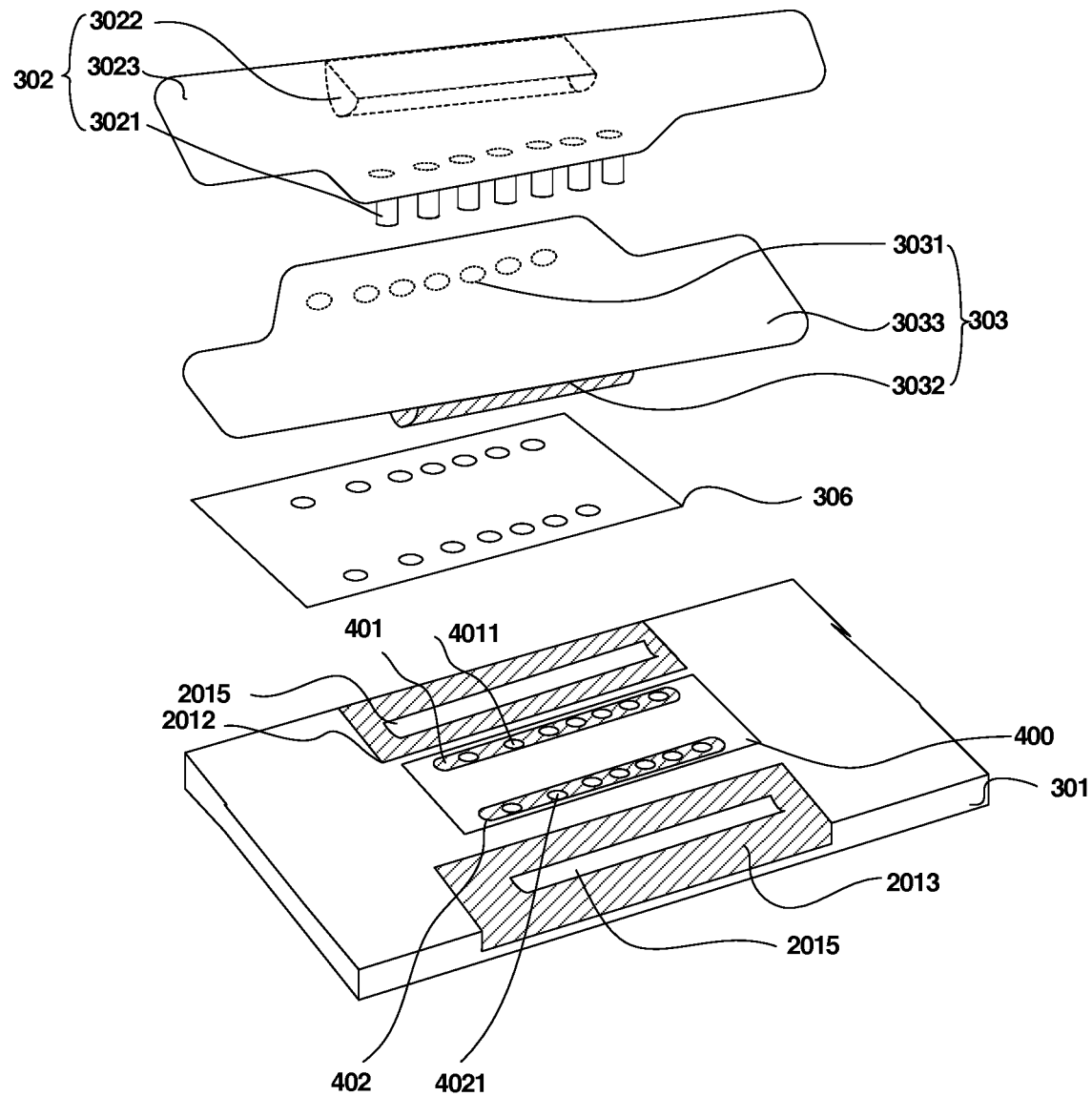
FIG. 16 is a schematic structural diagram illustrating a semiconductor packaging structure according to yet still another embodiment of the present disclosure.

FIG. 16 is a schematic structural diagram illustrating a semiconductor packaging structure according to another embodiment of the present disclosure. As shown in FIG. 16, a semiconductor packaging structure 300 according to the embodiments of the present disclosure is used to package the semiconductor chip 400, and the semiconductor chip 400 is a two-terminal device. The two-terminal device includes a first electrode 401 (such as an anode of a diode) and a second electrode 402 (such as a cathode of a diode). In this embodiment, the semiconductor packaging structure 300 for packaging the two-terminal device is similar to the semiconductor packaging structure 100 for packaging the three-terminal device described above.

The first electrode 401 and the second electrode 402 of the semiconductor chip 400 are respectively formed with electrode openings, namely first electrode openings 4011 and second electrode openings 4021. The position and the number of the electrode openings on the first electrode 401 and the second electrode 402 may be determined according to the specific structure of the chip. In some specific embodiments, a plurality of electrode openings may be respectively opened on the first electrode 401 and the second electrode 402. The shape of the electrode openings may be circular or other shapes.

The semiconductor packaging structure 300 includes a packaging chassis 301 and at least two extended electrodes. The packaging chassis 301 is provided with a plurality of pin electrodes respectively corresponding to the first electrode 401 and the second electrode 402, and a chip holding groove for accommodating the semiconductor chip 400. At least one groove 1015 is formed on a pin electrode. Optionally, the depth of the groove 2015 is not larger than the thickness of the pin electrode. In an embodiment, the pin electrode corresponding to the first electrode 401 is a first pin electrode 2012, and the pin electrode corresponding to the second electrode 402 is a second pin electrode 2013.

Each of the at least two extended electrodes includes conductive pillars for inserting into electrode openings opened on the first electrode 401 or the second electrode 402, and a conductive bump cooperated with the groove 2015 arranged on the pin electrode corresponding to the first electrode 401 or the second electrode 402.

In detail, in the embodiment, the at least two extended electrodes include a first extended electrode 302 and a second extended electrode 303.

The first extended electrode 302 includes first conductive pillars 3021 for inserting into the first electrode openings 4011 opened on the first electrode 401, and a first conductive bump 3022 cooperated with the groove 2015 arranged on the first pin electrode 2012 corresponding to the first electrode 401. In addition, the first extended electrode 302 further includes a first conductive body 3023, and the first conductive pillars 3021 and the first conductive bump 3022 are respectively disposed at two ends of the first conductive body 3023. The shape of the first conductive pillar 3021 may be a cylindrical or other shape, and its shape is matched with the shape of the electrode opening on the first electrode 401. The shape of the first conductive bump 3022 is matched with the shape of the groove 2015 opened on the first pin electrode 2012. The first conductive pillars 3021 are electrically connected to the first electrode 401 after being inserted into the first electrode opening 4011, and the first conductive bump 3022 is electrically connected to the first pin electrode 2012 after being inserted into the groove 2015 on the first pin electrode 2012, and thus the first electrode 401 and the first pin electrode 2012 are connected through the first extended electrode 302.

The second extended electrode 303 includes second conductive pillars 3031 for inserting into the second electrode openings 4012 opened on the second electrode 402, and a second conductive bump 3032 cooperated with the groove 2015 arranged on the second pin electrode 2013 corresponding to the second electrode 402. In addition, the second extended electrode 303 further includes a second conductive body 3033, and the second conductive pillars 3031 and the second conductive bump 3032 are respectively disposed at two ends of the second conductive body 3033. Similar to the structure of the first extended electrode 302, the second extended electrode 303 connects the second electrode 402 with the second pin electrode 2013 through the second conductive pillars 3031 and the second conductive bump 3032.

As shown in FIG. 16, a protective dielectric layer 306 may also be disposed on the packaging chassis 301. The protective dielectric layer 306 is similar to the protective dielectric layer 106 of the above embodiment, and will not be described herein.

Embodiments of the present disclosure also provide a semiconductor device which includes the above-described semiconductor chip and the semiconductor packaging structure.

In summary, the semiconductor package structure according to the embodiments of the present invention connects the semiconductor chip and the pin electrodes through the electrode openings on the semiconductor chip and the conductive pillars and the conductive bumps on the extended electrodes. The connection between the semiconductor chip and the pin electrodes can be realized without using a lead wire, thereby effectively avoiding the parasitic inductance introduced by the wire bonding connection, improving the situation that the signal oscillation is intensified under the high frequency working condition caused by the parasitic inductance, and further improving the quality of the electrical signal transmission of the high frequency device. The method of seamless connection of the conductive pillars and the conductive bumps with the corresponding electrodes and pin electrodes on the semiconductor chip respectively expands the electrical connection contact area, reduces the contact resistance between the electrodes, and realizes a reliable electrical connection. At the same time, the extended electrode can improve the extraction path of heat generated during the operation of the semiconductor chip, reduce the temperature rise of the semiconductor chip, and enhance the use efficiency and reliability of the semiconductor device. In addition, a packaging mold may also be customized according to the size of the semiconductor chip by using the packaging technology according to the embodiments of the present disclosure, and thus the packaging volume of the semiconductor device may be effectively reduced, and the miniaturization of the application of the semiconductor device module may be realized.

In the description of the present disclosure, it should be noted that terms "arrange", "connected with" and "connect" should be interpreted broadly unless specifically defined or limited otherwise. For example, "connected" may be a fixed connection, a detachable connection, or an integrated connection. It may be a mechanical connection or an electrical connection. It may be directly connected or indirectly connected through an intermediate medium, and it may be an internal connection between two components. For those skilled in the art, the specific meanings of the above terms in the embodiments of the present invention may be understood according to specific cases.

In the description of the embodiments of the present invention, it should also be noted that the terms "up", "down", "inner", "outer" and the like indicate the orientation or positional relationship based on the orientation or positional relationship shown in the drawings, or the orientation or positional relationship of the embodiments product when used conventionally. This is merely for convenience of describing the embodiments and simplification of the description, rather than to indicate or imply that the device or component referred to must have a specific orientation, be constructed and operated in a specific orientation, therefore it should not be understood as a limitation of the present invention.

While the present disclosure has been described with reference to exemplary embodiments, it will be apparent to those skilled in the art that various changes and modifications may be made without departing from the spirit and scope of the present invention. Therefore, the above embodi-

What is claimed is:

1. A semiconductor packaging structure for packaging a semiconductor chip, wherein the semiconductor chip comprises at least two electrodes, each of the at least two electrodes comprises at least one electrode opening, and the packaging structure comprises:
   a packaging chassis, provided with at least two pin electrodes respectively corresponding to the at least two electrodes; and
   at least two extended electrodes, each of the at least two extended electrodes being electrically connected to one of the at least two pin electrodes, and comprising at least one conductive pillar for inserting into the at least one electrode opening formed on one of the at least two electrodes.

2. The semiconductor packaging structure according to claim 1, wherein each of the at least two pin electrodes comprises at least one groove; and each of the at least two extended electrodes comprises at least one conductive bump cooperated with the at least one groove on each of the at least two pin electrodes.

3. The semiconductor packaging structure according to claim 2, wherein each of the at least two extended electrodes further comprises a conductive body, and the at least one conductive pillar and the at least one conductive bump on each of the at least two extended electrodes are respectively disposed at two ends of the conductive body.

4. The semiconductor packaging structure according to claim 2, wherein the semiconductor chip is a two-terminal device, the at least two electrodes comprise a first electrode and a second electrode, and the at least two extended electrodes comprise:
   a first extended electrode corresponding to the first electrode, the first extended electrode comprising at least one first conductive pillar for inserting into the at least one electrode opening formed on the first electrode, and at least one first conductive bump cooperated with at least one groove arranged on a pin electrode corresponding to the first electrode; and
   a second extended electrode corresponding to the second electrode, the second extended electrode comprising at least one second conductive pillar for inserting into the at least one electrode opening formed on the second electrode, and at least one second conductive bump cooperated with at least one groove arranged on a pin electrode corresponding to the second electrode.

5. The semiconductor packaging structure according to claim 4, wherein the at least two pin electrodes comprise a first pin electrode and a second pin electrode respectively corresponding to the first electrode and the second electrode, and the first pin electrode and the second pin electrode are respectively arranged at opposite ends of the packaging chassis.

6. The semiconductor packaging structure according to claim 2, wherein the semiconductor chip is a three-terminal device, the at least two electrodes comprise a source electrode, a drain electrode and a gate electrode, and the at least two extended electrodes comprise:
   a first extended electrode corresponding to the source electrode, the first extended electrode comprising at least one first conductive pillar for inserting into the at least one electrode opening formed on the source electrode, and at least one first conductive bump cooperated with at least one groove arranged on a pin electrode corresponding to the source electrode;
   a second extended electrode corresponding to the drain electrode, the second extended electrode comprising at least one second conductive pillar for inserting into the at least one electrode opening formed on the drain electrode, and at least one second conductive bump cooperated with at least one groove arranged on a pin electrode corresponding to the drain electrode; and
   a third extended electrode corresponding to the gate electrode, the third extended electrode comprising at least one third conductive pillar for inserting into the at least one electrode opening formed on the gate electrode, and at least one third conductive bump cooperated with at least one groove arranged on a pin electrode corresponding to the gate electrode.

7. The semiconductor packaging structure according to claim 6, wherein the at least two pin electrodes comprise a first pin electrode corresponding to the source electrode, a second pin electrode corresponding to the drain electrode, and at least one third pin electrode corresponding to the gate electrode, and the at least one third pin electrode is located at two ends corresponding to the gate electrode on the packaging chassis.

8. The semiconductor packaging structure according to claim 2, wherein the at least one groove is a groove with an arc-shaped bottom; and the at least one conductive bump is a bump matched with a curvature of the groove with the arc-shaped bottom.

9. The semiconductor packaging structure according to claim 2, wherein the at least one conductive bump comprises a plurality of bumps arranged at equal intervals, and the at least one groove is a plurality of blind holes which matched with the plurality of bumps.

10. The semiconductor packaging structure according to claim 2, wherein the at least one conductive bump comprises a plurality of bumps arranged in a plurality of columns, the number of bumps arranged in each column is different, and the at least one groove is a plurality of blind holes which matched with the plurality of bumps.

11. The semiconductor packaging structure according to claim 1, wherein each of the at least two electrodes comprises a plurality of electrode openings, the plurality of electrode openings are arranged at equal intervals or in a plurality of columns; and each of the at least two extended electrodes comprises a plurality of conductive pillars, the plurality of conductive pillars are arranged in a same pattern corresponding to the plurality of electrode openings on each of the at least two electrodes.

12. The semiconductor packaging structure according to claim 11, wherein the plurality of electrode openings are chamfered rectangular parallelepiped holes; and the plurality of conductive pillars corresponding to the plurality of electrode openings are chamfered rectangular parallelepiped pillars matched with the shape of the plurality of electrode openings.

13. The semiconductor packaging structure according to claim 1, wherein the at least one conductive pillar is a metal pillar pre-made in the at least one electrode opening, and at least one blind hole matched with the at least one metal pillar is formed on each of the at least two extended electrodes.

14. The semiconductor packaging structure according to claim 1, further comprising a chip holding groove for accommodating the semiconductor chip and a radiator fin disposed at a bottom of the chip holding groove.

15. The semiconductor packaging structure according to claim 14, wherein the radiator fin is a planar monolithic radiator fin or a heat sink formed of longitudinal multi-piece radiator fins.

16. A semiconductor device, comprising a semiconductor chip and a semiconductor packaging structure for packaging the semiconductor chip, wherein the semiconductor chip comprises at least two electrodes, each of the at least two electrodes comprises at least one electrode opening, and the packaging structure comprises:
- a packaging chassis, provided with at least two pin electrodes respectively corresponding to the at least two electrodes; and
- at least two extended electrodes, each of the at least two extended electrodes being electrically connected to one of the at least two pin electrodes, and comprising at least one conductive pillar for inserting into the at least one electrode opening formed on one of the at least two electrodes.

17. The semiconductor device according to claim 16, wherein each of the at least two pin electrodes comprises at least one groove; and each of the at least two extended electrodes comprises at least one conductive bump cooperated with the at least one groove on each of the at least two pin electrodes.

18. The semiconductor device according to claim 16, further comprising a passivation dielectric layer covering an upper surface of the semiconductor chip, wherein the at least one electrode opening passes through the passivation dielectric layer.

19. The semiconductor device according to claim 16, further comprising a protective dielectric layer disposed on the packaging chassis for covering a region other than the at least two pin electrodes, wherein the protective dielectric layer comprises at least one through hole corresponding to the at least one electrode opening.

20. The semiconductor device according to claim 19, wherein an upper surface of the protective dielectric layer is flush with an upper surface of the at least two pin electrode.

* * * * *